(12) United States Patent
Takahashi

(10) Patent No.: US 6,273,700 B1
(45) Date of Patent: Aug. 14, 2001

(54) MOLD STRUCTURE USED IN METHOD OF MOLDING CIRCUITRY

(75) Inventor: Toshiharu Takahashi, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/291,746

(22) Filed: Apr. 14, 1999

(30) Foreign Application Priority Data

Apr. 15, 1998 (JP) ................................................. 10-104924

(51) Int. Cl.⁷ ..................................................... B29C 45/14
(52) U.S. Cl. ................... 425/123; 264/261; 264/272.15; 264/277; 264/328.12; 425/577
(58) Field of Search ..................................... 425/123, 577; 264/277, 261, 272.15, 328.12

(56) References Cited

U.S. PATENT DOCUMENTS 4,453,903 * 6/1984 Pukaite et al. ........................ 425/123
4,776,803 * 10/1988 Pretchel et al. ...................... 264/277
6,048,482 * 4/2000 Lemke et al. ........................ 264/277

FOREIGN PATENT DOCUMENTS

782000 * 8/1957 (GB) .................................... 264/277
56-2162 * 1/1981 (JP) ..................................... 264/277

* cited by examiner

*Primary Examiner*—Robert Davis
(74) *Attorney, Agent, or Firm*—Sughrue, Mion, Zinn, Macpeak & Seas, PLLC

(57) ABSTRACT

A mold structure for molding a circuitry comprises a cavity to which a plurality of bus bars are juxtaposedly inserted provided with gap portions to which a resin material to be injected therethrough; and a plurality of holder pins provided on the respective gap portions and arranged alternatively in the juxtaposition direction of the plural bus bars to hold the respective bus bar to be inserted therebetween.

3 Claims, 4 Drawing Sheets

MOLD STRUCTURE USED IN METHOD OF MOLDING CIRCUITRY

BACKGROUND OF THE INVENTION

The present invention relates to a method of forming or molding a circuitry by molding a resin on a plurality of bus bars inserted at a small pitch (at small intervals) in a mold, and the present invention also relates to a mold structure used in this molding method.

A circuitry, having bus bars, is used in an internal circuit of an electric part such as a connector. This circuitry is produced by inserting a plurality of bus bars into a mold and then by injecting a resin into the mold to form a resin-molded portion. As a result, the resin-molded portion holds the bus bars in such a manner that the adjacent bus bars are kept out of contact with each other.

FIGS. 4 and 5 show a related method of molding such a circuitry. A mold 1 has a cavity portion 3 in which a plurality of bus bars 2 are held in a juxtaposed manner. Holder pins 4 are provided in the cavity portion 3, and these holder pins 4 hold the plurality of bus bars 2 at small intervals in such a manner that the bus bars will not contact with one another. The holder pins 4 are arranged substantially on a common straight line in a direction of juxtaposition of the bus bars 2.

In this method, the bus bars 2 are juxtaposed in the cavity portion 3 of the mold 1 in such a manner that each bus bar 2 is inserted between the associated holder pins 4, and then the mold is clamped, and then molten resin is injected into the cavity 1 through a gate (not shown). The molten resin thus injected flows in between the bus bars 2, and is solidified to form resin-molded portions 5, and each resin-molded portion 5, formed between the associated adjacent bus bars 2, holds these bus bars 2 out of contact with each other, as shown in FIG. 5.

In the above molding method, however, the holder pins 4 and the bus bars 2 are arranged so densely that the resin can not easily flow in between the bus bars 2, and therefore the resin-molded portions 5 are liable to be formed with insufficient length (short shot). And besides, since the holder pins 4 are arranged such that each of the bus bars 2 is held at two juxtaposed points on a common line perpendicular to an extending direction of the bus bars 2, each holder pin 4 functions as a rotational fulcrum for the associated bus bar 2, so that the bus bars 2 are liable to be turned as indicated by arrows in FIG. 6. This results in a problem that the adjacent bus bars 2 are brought into contact with each other. Furthermore, since the holder pins 4 are arranged on a common line, the holder pins 4 are disposed close to one another as shown in FIG. 7. Therefore, the whole of each holder pin 4, including its base portion 4a, can not be made thick, and therefore the holder pin 4 has a reduced strength, and is liable to be broken.

SUMMARY OF THE INVENTION

It is therefore an object of the present invention to provide a method of molding a circuitry in which a short shot of a molded resin is prevented, and bus bars are prevented from being turned, and holder pins have an increased strength. Another object of the present invention is to provide a mold structure suitably used in this molding method.

In order to achieve the above objects, there is provided a mold structure for molding a circuitry comprising: a cavity to which a plurality of bus bars are juxtaposedly inserted provided with gap portions to which a resin material to be injected therethrough; and a plurality of holder pins provided on the respective gap portions and arranged alternatively in the juxtaposition direction of the plural bus bars to hold the respective bus bar to be inserted therebetween.

In the mold structure, each of the bus bars is held by both sides of the holder pins at two different points in an extending direction thereof.

In the mold structure, each of the holder pins has a large-diameter base portion, and the holder pins are arranged such that the base portions of any adjacent holder pins are overlapped in an extending direction of the bus bars.

Since the holder pins are arranged alternatively, the adjacent holder pins are sufficiently spaced from each other. Therefore, the holder pins and the bus bars are not arranged densely, and the resin can easily flow in between the bus bars, so that the short shot of the resin is prevented. And besides, the adjacent holder pins are contacted respectively with right and left sides of the bus bar at two different points in the extending direction thereof to thereby hold the bus bar, and therefore the bus bar will not be turned, and the bus bars will not be brought into contact with each other. Furthermore, the adjacent holder pins are sufficiently spaced from each other, and therefore the holder pins can be made thick to have an increased strength.

According to the present invention, there is also adopted a method of molding a circuitry, in which a plurality of bus bars are juxtaposed with predetermined intervals, comprising the steps of: preparing a mold structure comprising a cavity, and a plurality of holder pins provided with the predetermined intervals and arranged alternatively in the juxtaposition direction thereof; inserting the plural bus bars juxtaposedly into the cavity through respective spaces between the holder pins; injecting a resin material into respective spaces between the bus bars through the cavity; and solidifying the resin material to keep the bus bars out of contact with each other.

DETAILED DESCRIPTION OF THE PREFERRED EMBODIMENT

Figure 1:
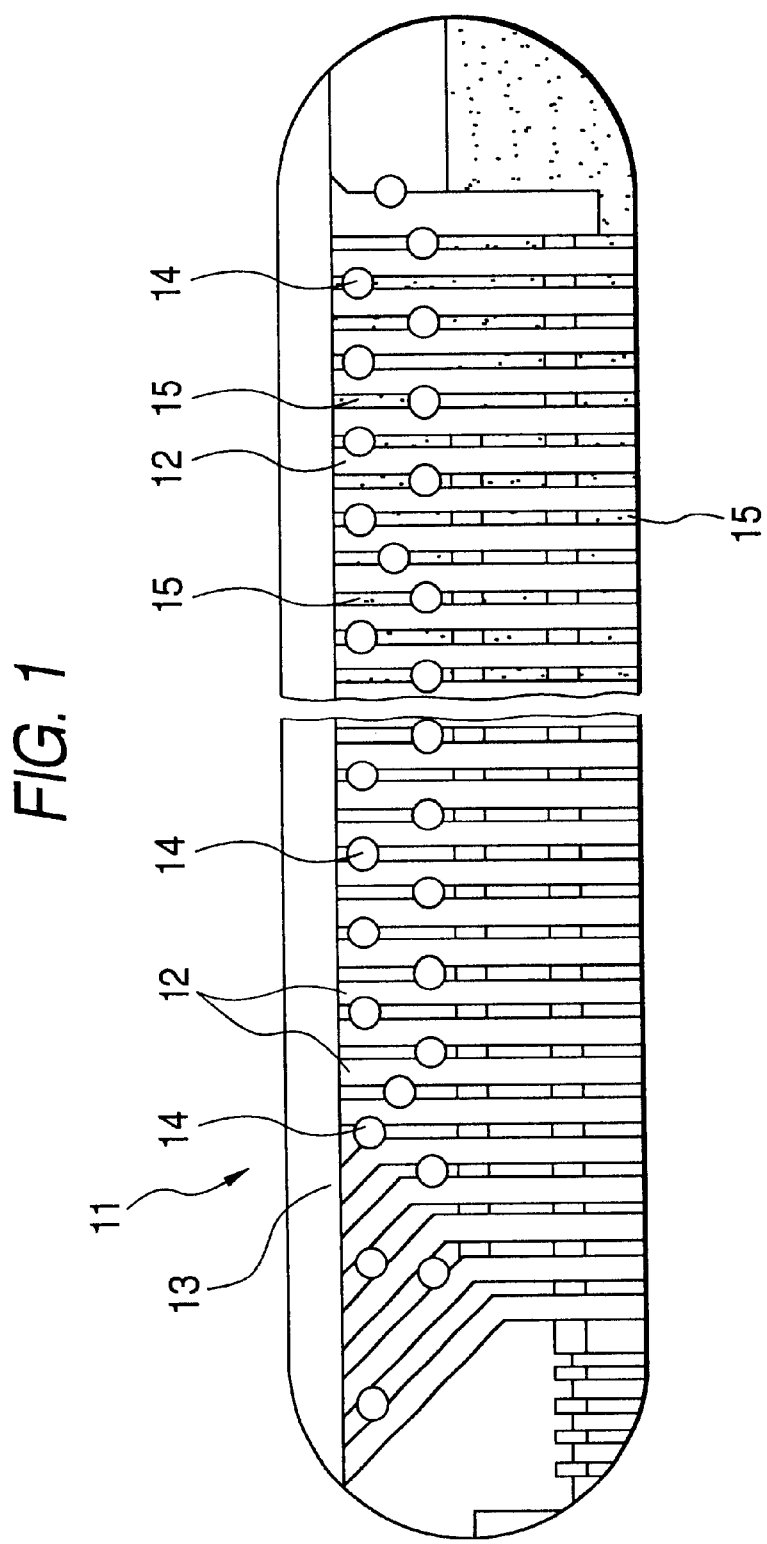
FIG. 1 is a plan view of a mold used in one preferred embodiment of the present invention.

FIG. 1 shows one preferred embodiment of a mold 11 of the present invention. This mold 11 has a cavity portion 13, and a plurality of bus bars 12 are juxtaposed in the cavity portion 13, and in this condition a resin is molded on the bus bars. A plurality of holder pins 14 are provided in the cavity portion 13, and these holder pins 14 hold the bus bars 12 inserted in the mold 11 in such a manner that each bus bar 12 is held between the associated adjacent holder pins 14. The holder pins 14 are so arranged that the bus bars 12 can be juxtaposed to one another at small intervals.

Figure 3:
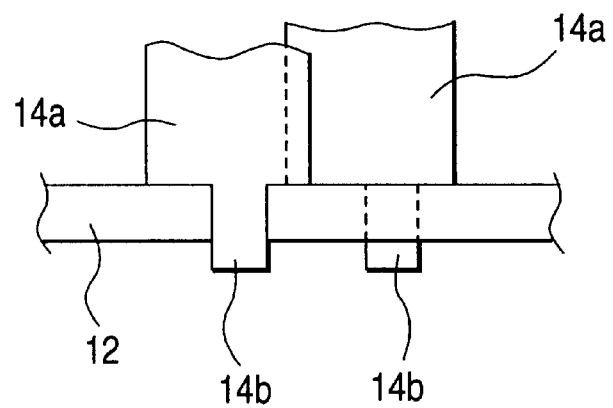
FIG. 3 is a side view showing the operation of the holder pin.
Figure 4:
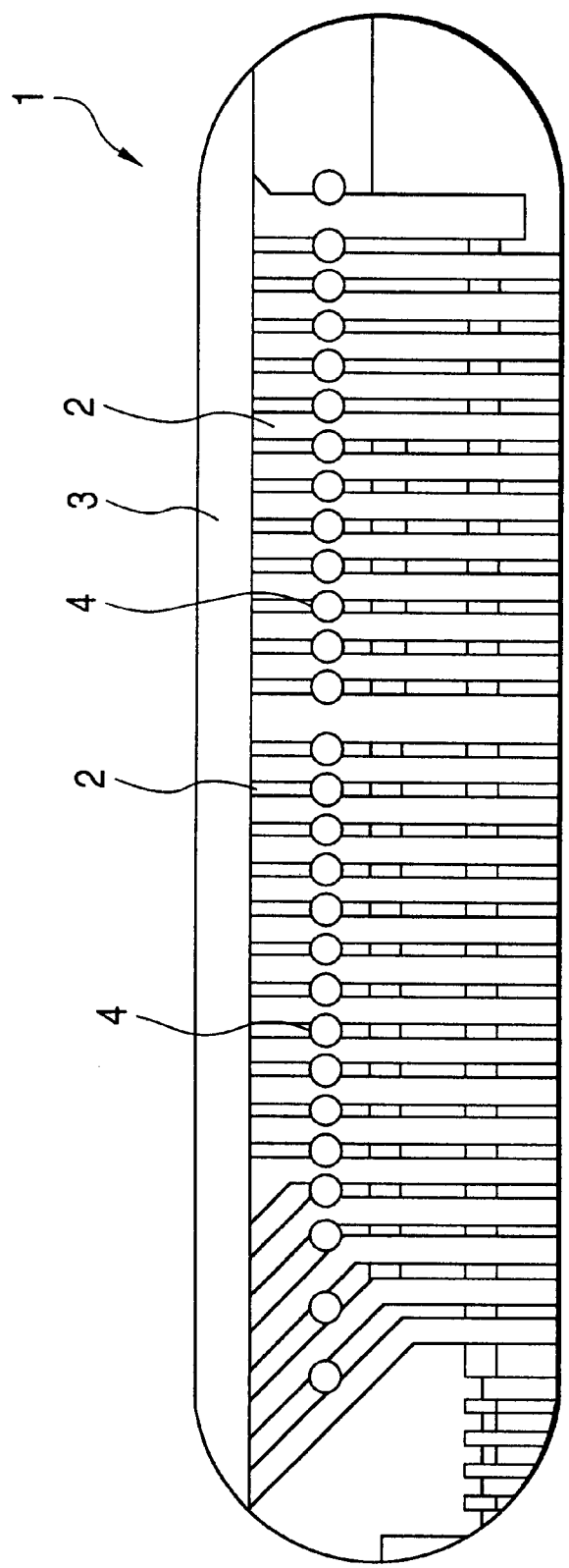
FIG. 4 is a plan view of a mold used in a related method.
Figure 5:
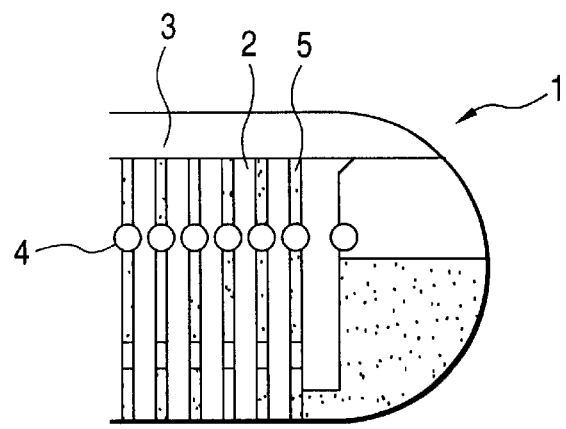
FIG. 5 is an enlarged plan view of a portion of FIG. 4.
Figure 6:
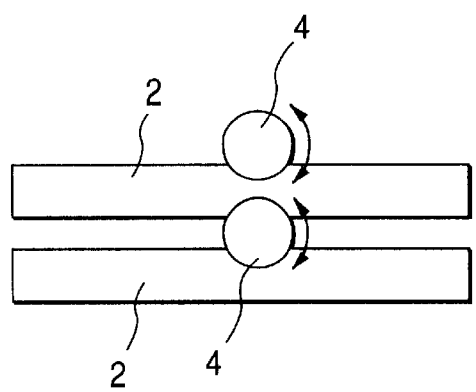
FIG. 6 is a plan view showing a condition in which each bus bar is inserted between holder pins in the related mold.
Figure 7:
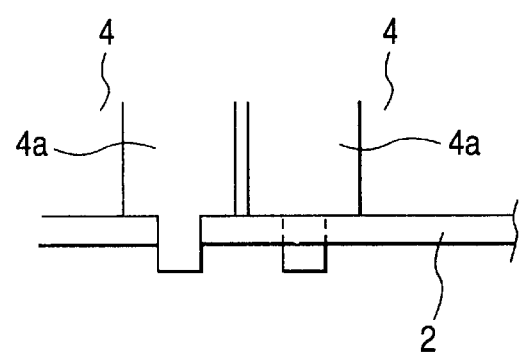
FIG. 7 is a side-elevational view showing the related holder pins.

As shown in FIG. 3, each holder pin 14 includes a base portion 14a of a larger diameter, and a holder portion 14b of a smaller diameter formed at a distal end of the base portion 14a. Each bus bar 2 is inserted between the associated holder portions 14b, so that the holder pins 14 function to hold the bus bar 12. The holder pins 14 are arranged alternatively (i.e., a zigzag manner) in a direction of juxtaposition of the bus bars 12 (transversal direction in FIG. 1), so that any two adjacent ones of the holder pins 14 are not disposed on a common line in this juxtaposition direction. Therefore, when the bus bar 12 is inserted between the adjacent holder pins 14, the adjacent holder pins 14 hold the bus bar 12 therebetween in such a manner that these pins 14 are contacted respectively with two different points (portions) of the bus bar 2 spaced from each other in an extending direction of the bus bar 2.

For molding a circuitry of this embodiment, the bus bars 12 are inserted into the cavity portion 13 of the mold 11. In this inserting operation, each bus bar 12 is inserted between the associated adjacent holder pins 14. Therefore, each bus bar 12 is held by the adjacent holder pins 14, so that the bus bars 12 will not be brought into contact with each other. The bus bars 12 are thus held by the holder pins 14, and in this condition the mold is clamped or closed, and molten resin is injected into the mold 11. The molten resin thus injected flows in between the bus bars 2 and between the holder pins 14 as shown in a right half portion of FIG. 1, and then is solidified to form resin-molded portions 15, and each resin-molded portion 15, formed between the associated adjacent bus bars 12, holds these bus bars 12 out of contact with each other.

In this embodiment, the holder pins 14 for holding the bus bars 12 are arranged alternatively, and therefore any two adjacent ones of the holder pins are not disposed on a common line in the direction of juxtaposition of the bus bars 12. Therefore, the adjacent holder pins 14 are sufficiently spaced from each other, and the holder pins 14 and the bus bars 12 are not arranged densely. Therefore, the resin can easily flow in between the bus bars 12, and a short shot of the resin will not occur.

Figure 2:
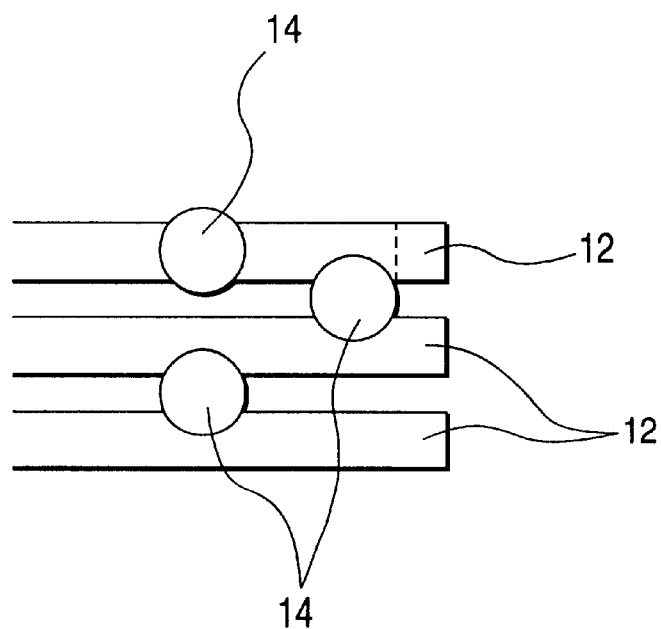
FIG. 2 is a plan view showing a condition in which each bus bar is inserted between holder pins.

As shown in FIG. 2, the adjacent holder pins 14 are contacted respectively with the right and left sides of the bus bar 2 at two different points thereof, spaced from each other in the extending direction thereof the bus bar 2, to thereby hold the bus bar 2, and therefore the bus bar 2 will not be turned. Therefore, the contact of the bus bars 2 with each other due to such turning movement is eliminated. And besides, the adjacent holder pins 14 are sufficiently spaced from each other, and therefore the base portion 14a can be made so thick that it overlaps the base portion 14a of the adjacent holder pin 14, as shown in FIG. 3. As a result, the holder pin 14 can be increased in overall strength, and will not be broken.

In this embodiment, although the resin is injected into the mold 11, the resin-molded portions 15 can be formed by an injection blow molding, an extrusion molding or the like.

As has been described heretofore, according to the present invention, the holder pins for holding the bus bars are arranged alternatively, and therefore the holder pins and the bus bars are not arranged densely, and the short shot of the resin is prevented. And besides, each bus bar is held at two different points in the extending direction thereof, and therefore the bus bar is prevented from being turned, and therefore will not be brought into contact with the adjacent bus bar, and each holder pin can be made thick to have an increased strength.

Although the present invention has been shown and described with reference to specific preferred embodiments, various changes and modifications will be apparent to those skilled in the art from the teachings herein. Such changes and modifications as are obvious are deemed to come within the spirit, scope and contemplation of the invention as defined in the appended claims.

What is claimed is:

1. A mold structure for molding circuitry comprising:

a mold member having a cavity into which a plurality of bus bars are juxtaposedly inserted, the bus bars being provided with gap portions into which resin material is to be injected; and a plurality of holder pins provided in the respective gap portions and arranged alternatively in the juxtaposition direction of the plural bus bars to hold the respective bus bar therebetween.

2. The mold structure as set forth in claim 1, wherein each of the bus bars is held by both sides of the holder pins at two different points in an extending direction thereof.

3. The mold structure as set forth in claim 1, wherein each of the holder pins has a large-diameter base portion, and wherein the holder pins are arranged such that the base portions of any adjacent holder pins are overlapped in an extending direction of the bus bars.

* * * * *